(12) United States Patent
Aoki et al.

(10) Patent No.: US 7,656,744 B2
(45) Date of Patent: Feb. 2, 2010

(54) MEMORY MODULE WITH LOAD CAPACITANCE ADDED TO CLOCK SIGNAL INPUT

(75) Inventors: Yurika Aoki, Tokyo (JP); Seiji Funaba, Tokyo (JP); Yoji Nishio, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 360 days.

(21) Appl. No.: 11/611,036

(22) Filed: Dec. 14, 2006

(65) Prior Publication Data

US 2007/0140040 A1    Jun. 21, 2007

(30) Foreign Application Priority Data

Dec. 15, 2005    (JP) .............................. 2005-362005

(51) Int. Cl.
*G11C 8/00*    (2006.01)
(52) U.S. Cl. ....................... 365/233.1; 365/51; 365/149; 365/202
(58) Field of Classification Search ................. 365/193, 365/194, 233.1, 233.13, 51, 52, 149, 202
See application file for complete search history.

(56) References Cited

U.S. PATENT DOCUMENTS 5,495,435 A * 2/1996 Sugahara ..................... 365/52

6,128,748 A * 10/2000 MacWilliams et al. ....... 713/401
7,313,715 B2 * 12/2007 Yoo et al. .................... 713/500
7,412,616 B2 * 8/2008 Matsui et al. ................ 713/401
7,457,174 B2 * 11/2008 Braun et al. ................. 365/193

FOREIGN PATENT DOCUMENTS

| JP | 11-191019 A | 7/1999 |
|---|---|---|
| JP | 2004-70800 A | 3/2004 |
| JP | 2004-138480 A | 5/2004 |
| JP | 2004-531981 A | 10/2004 |
| JP | 2005-78547 A | 3/2005 |

* cited by examiner

*Primary Examiner*—Tuan T Nguyen
*Assistant Examiner*—Alexander Sofocleous
(74) *Attorney, Agent, or Firm*—Sughrue Mion, PLLC (57) ABSTRACT

A novel memory module with a multiple-rank configuration is provided to solve the problem that high-speed operation is impossible due to the fact that timing of a data strobe signal input to a memory is deviated from timing of a clock signal input thereto. In the memory module, a load capacity is provided at the vicinity of a clock signal input pin of a phase-locked loop circuit where the clock signal is input to match a time constant of a data strobe signal line with a time constant of a clock signal line. The matching of the input timings of the clock signal and the data strobe signal input to the memory enables the memory module to operate at a high speed.

6 Claims, 13 Drawing Sheets

MEMORY MODULE WITH LOAD CAPACITANCE ADDED TO CLOCK SIGNAL INPUT

This application claims priority to prior Japanese application JP 2005-362005, the disclosure of which is incorporated herein by reference.

BACKGROUND OF THE INVENTION

1. Field of the Invention

The present invention relates to a memory module, and in particular to a memory module optimal for use in a multiple-rank memory system.

2. Description of the Related Art

Memory systems are employed various types of electronic equipment such as personal computers (hereafter, referred to as "PCs"), digital cameras, and printers, and their memory capacity has been increased more and more. One of these memory systems is for example a memory system used in a PC and having a plurality of dual inline memory modules (DIMMs). Each of the DIMMs has terminals on the opposite surfaces of a module board, and is provided with semiconductor memories, a phase-locked loop circuit (PLL) for phase adjustment, a register for supplying a control signal, and so on. The semiconductor memories used here are large-capacity dynamic random access memories (DRAM).

The memory system is optimized for relevant electronic equipment by properly determining a memory capacity, a number of data bits, and a number of ranks, and is provided with a single or a plurality of memory modules. The term "a rank" means a group of memories that can be read and written simultaneously.

Figure 1:
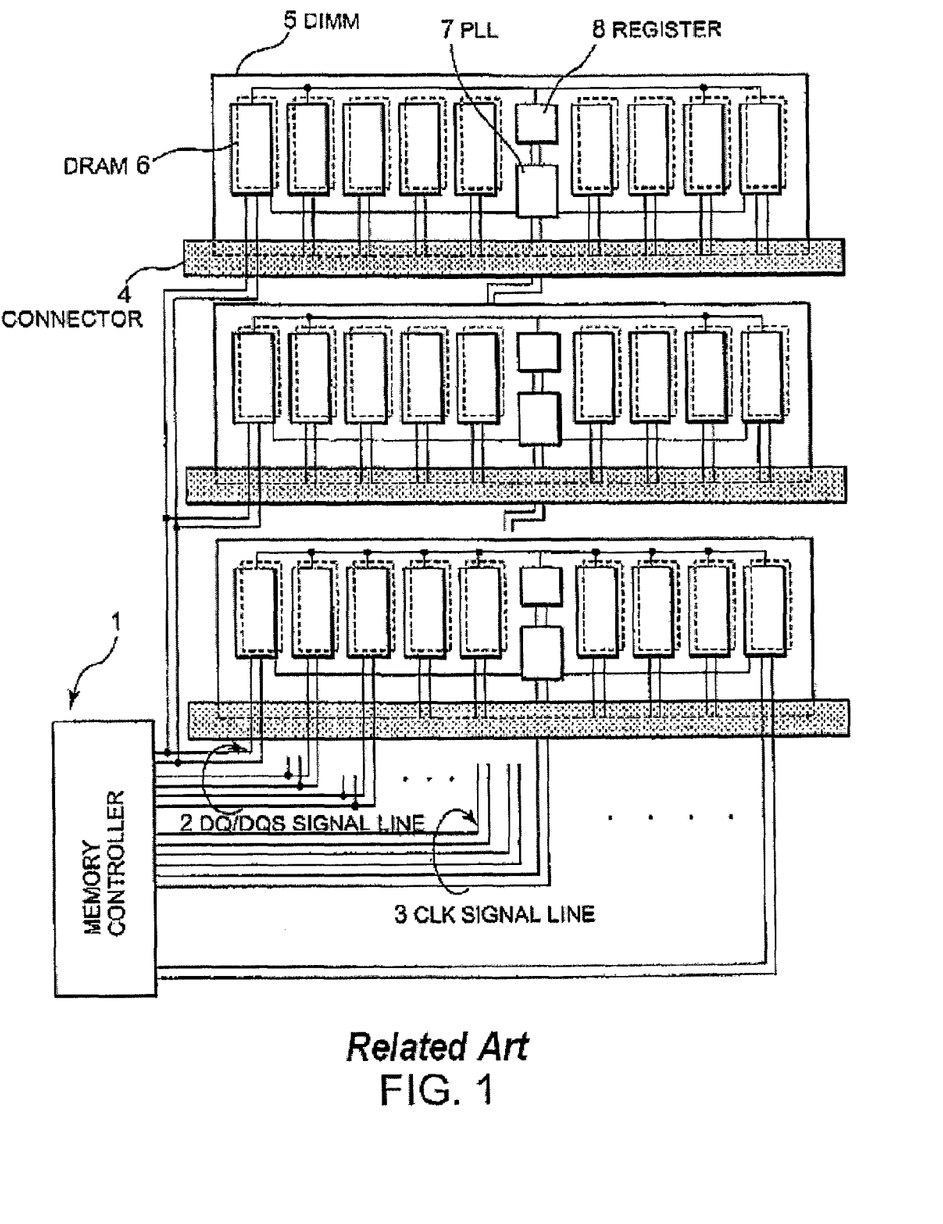
FIG. 1 is a schematic diagram showing a related memory system.

FIG. 1 shows a schematic diagram of a three-slot memory system. The memory system includes a motherboard that is provided thereon with a memory controller 1, and a plurality of wirings including data or data strobe (DQ/DQS) signal lines 2 and clock (CLK) signal lines 3. Because data, data strobe and clock signals are differential or complementary signals, the signal lines 2 and 3 are depicted as signal line pairs.

The memory system of FIG. 1 further includes a connector 4 and a DIMM 5 in each slot. The DIMM 5 has a plurality of DRAMs 6, a PLL 7, and a register 8 mounted on the memory module board. The DIMM 5 is also referred to as the "registered DIMM".

Figure 2:
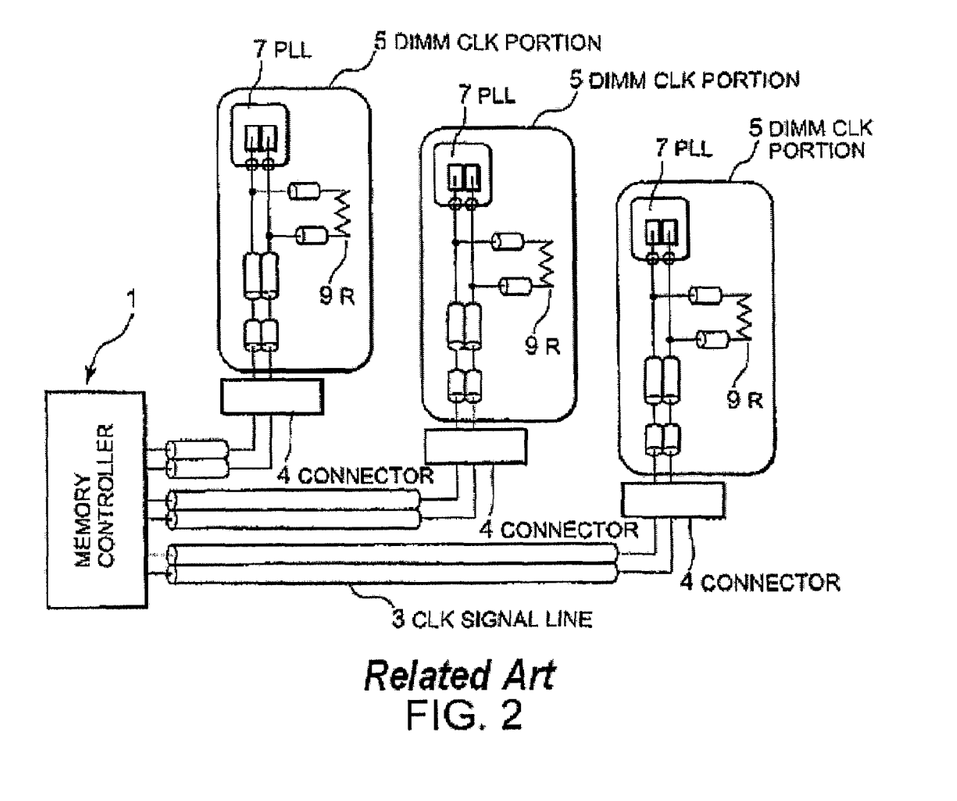
FIG. 2 is a topology diagram showing CLK signal lines in the memory system of FIG. 1.
Figure 3:
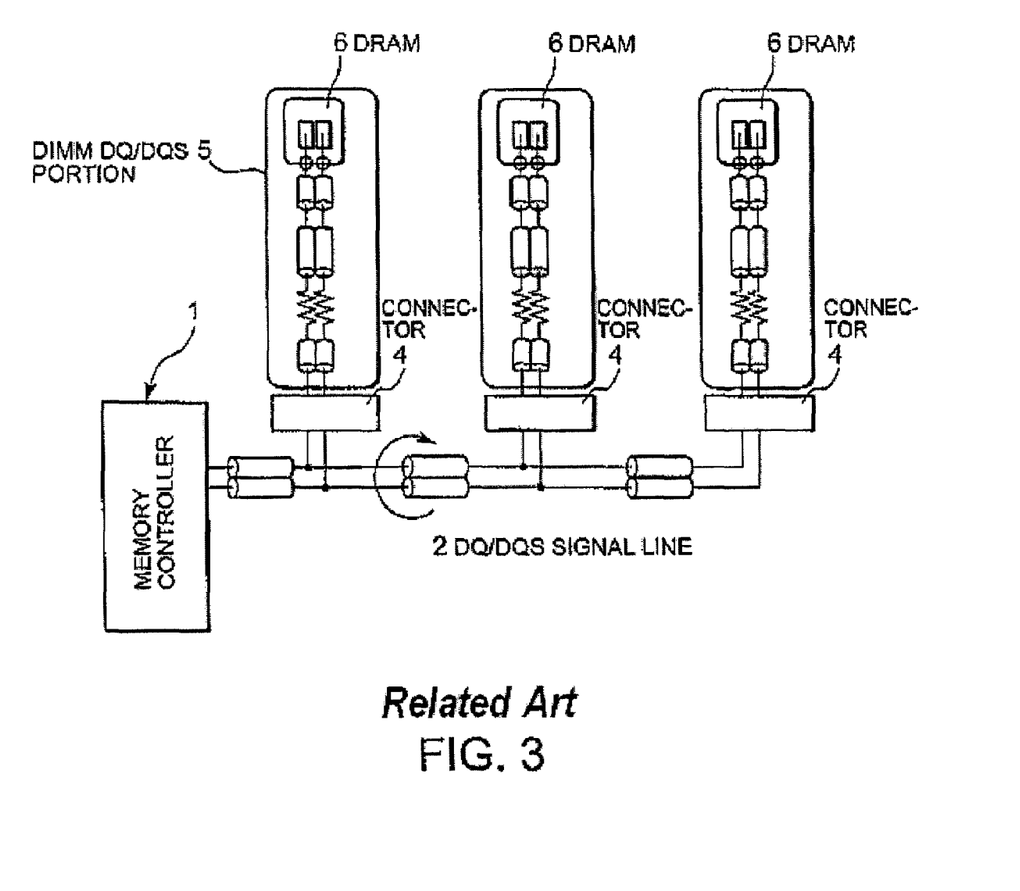
FIG. 3 is a topology diagram showing DQ/DQS signal lines when a one-rank DIMM is used in the memory system of FIG. 1.
Figure 4:
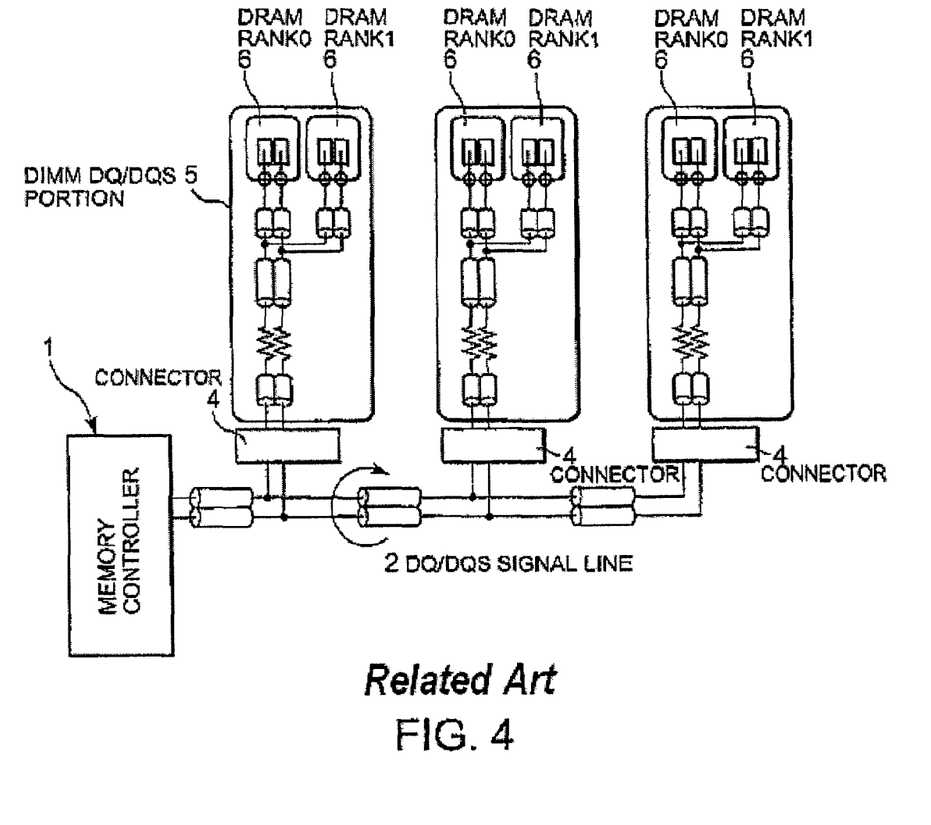
FIG. 4 is a topology diagram showing DQ/DQS signal lines when two-rank DIMM is used in the memory system of FIG. 1.

In the memory system shown in FIG. 1, each of the CLK signal lines 3 is connected to one of the DIMMs 5. On the other hand, each of the DQ/DQS signal lines 2 is connected to all of the DIMMs 5 by being branched therefrom. FIG. 2 is a topology diagram illustrating the CLK signal lines 3 in this memory system. FIGS. 3 and 4 are topology diagrams illustrating the DQ/DQS signal lines 2 when one-rank and two-rank DIMMs are used in the memory system, respectively.

As shown in FIG. 2, the CLK signal lines 3 are connected such that a CLK signal is supplied to the PLL 7 of each DIMM 5 from the memory controller 1 via the corresponding pair of CLK signal lines 3 and the corresponding connector 4 on the motherboard.

The DQ/DQS signal lines 2 are branched from the motherboard wirings and connected to the DRAMs 6 of the entire DIMMs 5 via the respective connectors 4. In the case of the one-rank DIMMs shown FIG. 3, a DQ/DQS signal is supplied to one DRAM of each DIMM 5. In the case of two-rank DIMMs shown in FIG. 4, a DQ/DQS signal is supplied to two DRAMs (RANK0 and RANK1) of each DIMM. The terms "CLK signal lines 3" and "DQ/DQS signal lines 2" are used herein to generally refer to the wirings including internal wirings of the DIMMs 5.

Figure 5:
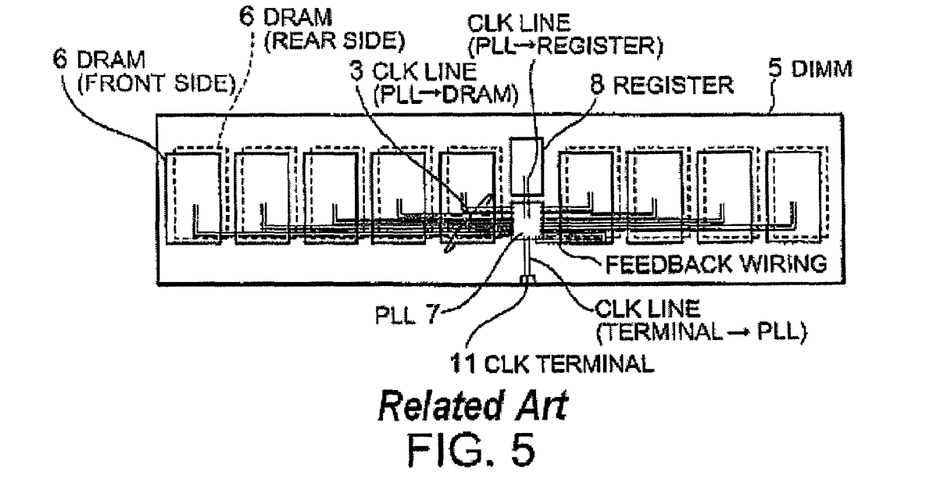
FIG. 5 is a diagram showing CLK signal lines in a related registered DIMM.
Figure 6:
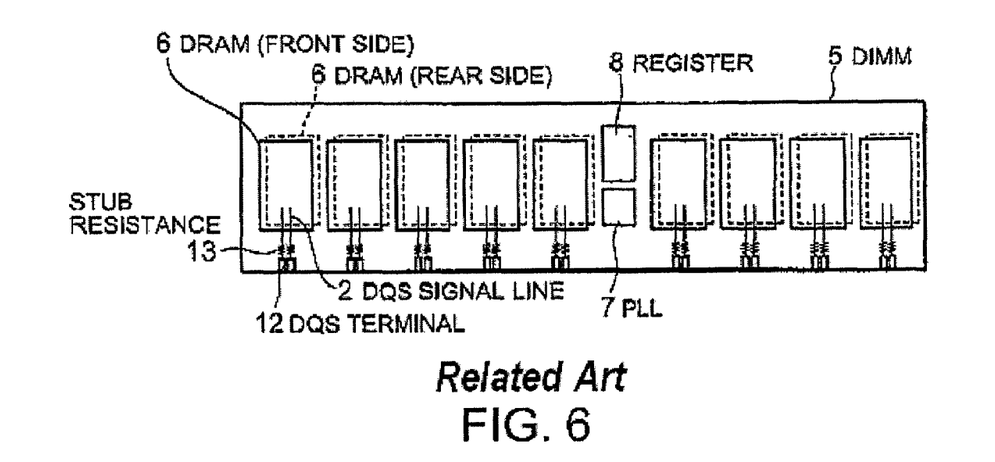
FIG. 6 is a diagram showing DQS signal lines in the related registered DIMM.

FIG. 5 shows an example of the CLK signal lines 3 in the registered DIMM 5, and FIG. 6 shows an example of the DQS signal lines 2 in the registered DIMM 5. As shown in FIG. 5, a CLK signal output from the memory controller 1 is input to the PLL 7 through CLK terminals 11 of the DIMM 5. The CLK signal is buffered by the PLL 7, and input to the register 8 and to the DRAMs 6 mounted on the front and rear surfaces of the DIMM 5. The CLK signal lines 3 connecting between the PLL 7 and the respective DRAMs 6 in the DIMM 5 are equal in length. Feedback wirings having an equal length to the CLK signal lines 3 connecting between the PLL 7 and the DRAMs 6 are provided to check the delay time in the CLK signal lines 3 of the DIMM 5.

On the other hand, a DQS signal output from the memory controller 1 is input to at least one of the DRAMs 6 via corresponding DQS terminals 12 and corresponding stub resistances 13. The CLK signal input to the DRAMs 6 via the PLL 7 is processed by the PLL 7 to enter the DRAMs 6 at the same timing as the timing when the CLK signal enters the PLL 7. Accordingly, it can be considered that the timing of the CLK signal entering the PLL 7 is the same as the timing of the CLK signal entering the DRAMs 6.

When data is written in the DRAM 6, the DRAM 6 latches the written data transmitted by the data signal DQ in response to the data strobe signal DQS. The CLK signal and the DQS signal are complementary signals (CLK and CLKB, DQS and DQSB), respectively, and their timings are decided based on the respective cross points. Deviation of the cross points that occurs between the CLK signal and the DQS signal when the DRAM 6 latches data during writing is referred to as tDQSS. The tDQSS can be reworded as "[the difference in flight time (propagation time) from the memory controller to the DRAM between the CLK signal and the DQS signal]+[the deviation of timing when the CLK signal and the DQS signal are output from the controller]".

The tDQSS is desirably small. This is because a large tDQSS will disable the normal transfer of data from the DQS signal to the CLK signal within the DRAM. According to the standard JEDEC DDR2 specification, therefore, the tDQSS is limited to ±0.25×tCK (tCK denotes one cycle time of the CLK signal), and the tDQSS is ±750 ps in DDR2-667. The specification means that the tDQSS becomes smaller as the operating frequency becomes higher. Therefore, it is crucial to reduce the tDQSS in order to increase the operation speed.

Figure 7:
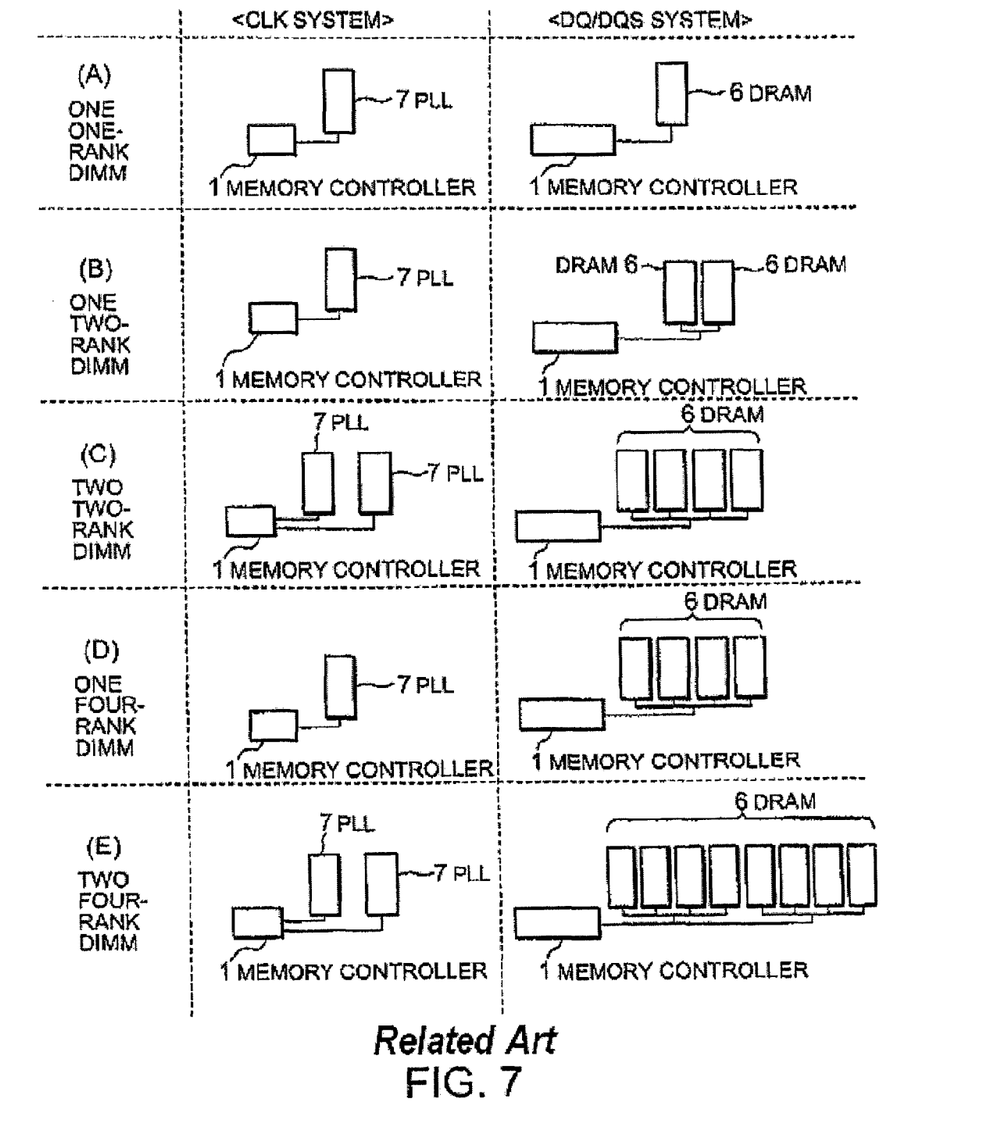
FIG. 7 is an explanatory diagram illustrating numbers of loads of CLK and DQS signals in the memory system.

FIG. 7 is an explanatory drawing for explaining relationship among the numbers of DIMMs and ranks forming the memory system and the numbers of CLK and DQS signal loads. Table 1 below shows the numbers of CLK and DQS signal loads. As seen from FIG. 7 and Table 1, in the case (A) of one one-rank DIMM, the number of CLK signal loads is one, and the number of DQ/DQS signal loads is one. In the case (B) of one two-rank DIMM, the number of CLK signal loads is one, and the number of DQ/DQS signal loads is two. In the case (C) of two two-rank DIMMs, the number of CLK signal loads is one, and the number of DQ/DQS signal loads is four. In the case (D) of one four-rank DIMM, the number of CLK signal loads is one, and the number of DQ/DQS signal loads is four. In the case (E) of two four-rank DIMMs, the number of CLK signal loads is one, and the number of DQ/DQS signal loads is eight.

TABLE 1

| Case | Number of loads when load of one one-rank DIMM is defined as 1 | CLK | DQS |
| --- | --- | --- | --- |
| (A) | 1 one-rank DIMM | 1 | 1 |
| (B) | 1 two-rank DIMM | 1 | 2 |
| (C) | 2 two-rank DIMMs | 1 | 4 |

TABLE 1-continued

| Case | Number of loads when load of one one-rank DIMM is defined as 1 | CLK | DQS |
|---|---|---|---|
| (D) | 1 four-rank DIMM | 1 | 4 |
| (E) | 2 four-rank DIMMs | 1 | 8 |

Figure 8:
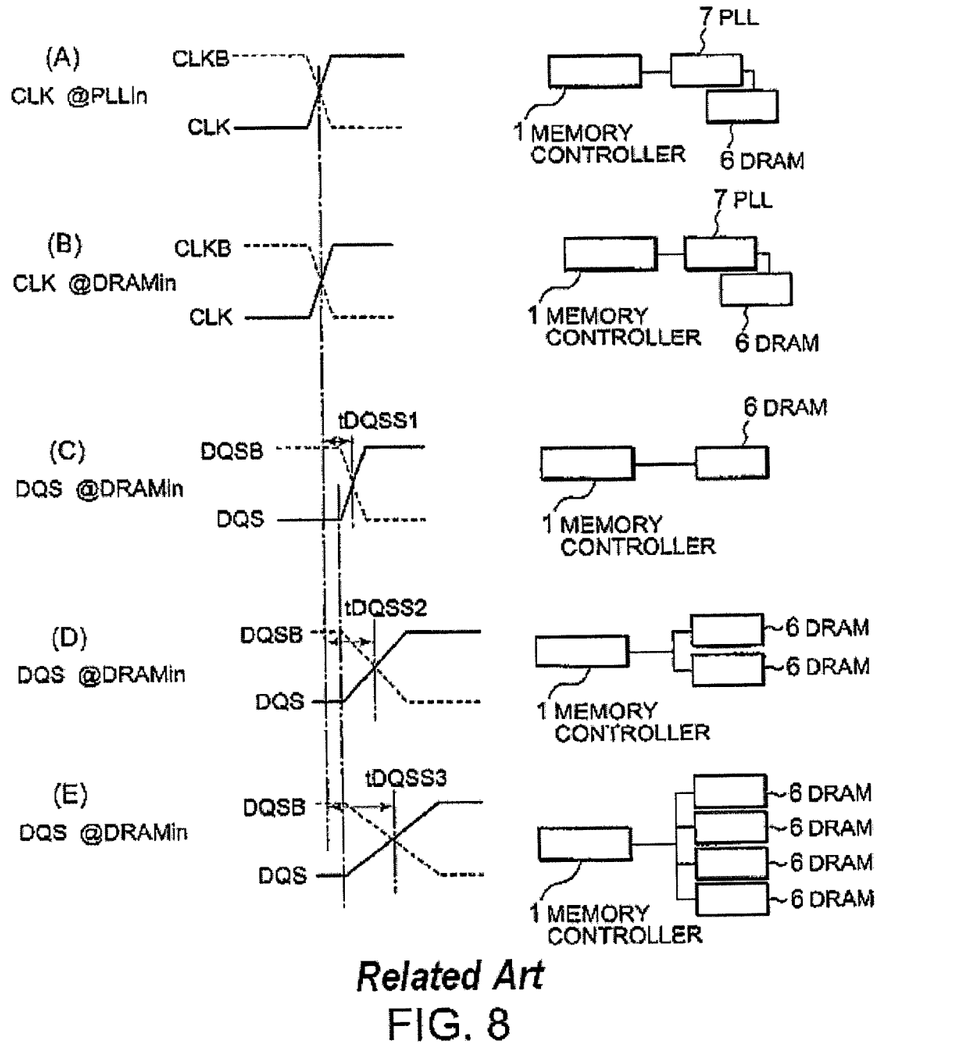
FIG. 8 shows schematic block diagrams of memory systems and respective waveform diagrams of CLK and DQS signal lines corresponding thereto.

FIG. 8 is schematic block diagrams showing the memory systems and signal waveform diagrams thereof. The load of the CLK signal is not changed from the number of loads F/O=1 even if the number of the DIMMs inserted into the slots or the number of ranks of DIMMs is increased. In contrast, the load of the DQS signal is increased as F/O=1, 2, 4 onwards along with the increase of the number of DIMMs or the number of ranks of the DIMMs. Accordingly, the DQS signal is delayed by tDQSS1 relative to the CLK signal when the number of loads is one, delayed by tDQSS2 when the number of loads is two, and by tDQSS3 when the number of loads is four.

In general, the same motherboard is used even after various configuration factors of the memory system (e.g., the number of DIMMs and the number of ranks) have been changed. Therefore, the slew rate (gradient) of the DQS waveform becomes low (the waveform deteriorates) as the number of DIMMs and/or the number of ranks is increased, and the timing at the cross point is delayed. However, since the load of the CLK signal is not changed, the waveform of the CLK signal is not changed and the timing at the cross point is not delayed. As a result, the tDQSS is increased along with the increase of the number of DIMMs and/or the number of ranks, eventually exceeding the tDQSS specification that becomes more severe along with the increase of the operation speed. This may result in breakage of the memory system.

The following three patent publications disclose prior arts relating to a memory system having a memory module. Japanese Laid-Open Patent Publication No. 2004-70800 (Patent Publication 1) discloses a technique in which timing of clocks CLK input to a PLL, a register, and DRAMs is adjusted such that a margin of command and address setup time before the CLK is equal to that of command and address hold time after the CLK. Japanese Patent KOHYO Publication NO. 2004-531981 (published Japanese patent translation of PCT application) (Patent Publication 2) discloses a technique in which a clock CLK is delayed by phase data derived from a data strobe signal DQS. Japanese Laid-Open Patent Publication No, 2005-78547 (Patent Publication 3) discloses a technique in which delay of a DQS signal relative to an internal clock signal is determined to synchronize data DQ to an internal clock.

Additionally, Japanese Laid-Open Patent Publication No. 2004-138480 (Patent Publication 4) discloses a test system which is design to eliminate effect of wiring impedance in an LSI tester and a performance board by inputting a data signal at a clock to a first-stage register from a clock selection circuit. Japanese Laid-Open Patent Publication No. H11-191019 (Patent Publication 5) discloses a clock driver circuit which detects waveform deterioration in an output and changes its drive capacity.

These Patent Publications describe various techniques relating to synchronization to the clock and techniques to correct the output waveform. However, these clock synchronization techniques involve detecting a phase difference, and thus require a circuit for this purpose. None of these Patent Publications describe a technique relating to synchronization to a device to which a clock signal is input, or a technique suggesting solutions of the present invention.

According to the conventional techniques as described above, the tDQSS is increased along with the increase of the number DIMMs and/or the number of ranks, eventually exceeding the tDQSS specification that becomes more severe along with the increase of the operation speed, and resulting in breakage of the memory system.

SUMMARY OF THE INVENTION

In view of the problem as described above, it is therefore an object of the present invention to provide a memory module having multiple ranks and which does not malfunction at a high frequency by matching timings of a clock (CLK) signal and a data strobe (DQS) signal received by each of memories without increasing the occupying area.

In order to solve the problem described above, the present invention basically employs techniques as described below. It is obvious that various changes and modifications that may be made without departing from the sprit or scope of the invention are also included in the present invention.

According to a first aspect of the present invention, a memory module with a multiple-rank configuration includes a phase-locked loop circuit for distributing a clock signal to memories, and a load capacity provided at a clock signal input portion of the phase-locked loop circuit in order to match input timings of a clock signal and a data strobe signal entering each of the memories.

According to a second aspect of the present invention, in the memory module of the first aspect, the load capacity is set such that a time constant of a data strobe signal line represented by a product of a sum of a stub resistance and a wiring impedance in a wiring transmitting the data strobe signal multiplied by an input pin capacity of each memory receiving the data strobe signal is equal to a time constant of a clock signal line represented by a product of a sum of the load capacity and a clock signal input pin capacity of the phase-locked loop circuit multiplied by a wiring impedance of the clock signal.

According to a third aspect of the present invention, in the memory module of the second aspect, the load capacity is added to each of complementary signal lines of the clock signal.

According to a fourth aspect of the present invention, in the memory module of the second aspect, another load capacity having a half of a capacity value of the load capacity is provided between complementary signal lines of the clock signal as a substitute for the load capacity.

According to a fifth aspect of the present invention, in the memory module of the second aspect, one end of the load capacity provided within the phase-locked loop circuit is connected to a dummy pin, and a clock signal input pin of the phase-locked loop circuit is connected to the dummy pin.

According to a sixth aspect of the present invention, in the memory module of the second aspect, the opposite ends of another load capacity having a half of a capacity value of the load capacity and provided within the phase-locked loop circuit as a substitute for the load capacity are connected to dummy pins, respectively, and complementary clock signal input pins of the phase-locked loop circuit are connected to the dummy pins, respectively.

According to a seventh aspect of the present invention, in the memory module of the second aspect, a layout design for the clock signal within a memory module board, including a characteristic impedance, a wiring length, a wiring width, wiring layers, a stub resistance value, terminal ends and so on of a wiring extending between a clock terminal and an input pin of the phase-locked loop circuit is made equal to a layout design for the data strobe signal including a characteristic impedance, a wiring length, a wiring width, wiring layers, a stub resistance value, terminal ends and so on of a wiring extending between a data strobe terminal and an input pin of each memory; and the load capacity is added to the clock signal input portion of the phase-locked loop circuit whereby a total capacity value of data strobe signal input pins of the memories connected to the data strobe signal is made equal to a capacity value of the clock signal input portion of the phase-locked loop circuit.

According to eighth aspect of the present invention, in the memory module of the first aspect, the load capacity is set such that a time constant of a data strobe signal line in a signal wiring transmitting the data strobe signal from a memory controller to an input pin of each memory is equal to a time constant of a clock signal line in a signal wiring transmitting the clock signal from the memory controller to an input pin of the phase-locked loop circuit.

Thus, the present invention provides a memory module with a multiple-rank configuration, in which a load capacity is provided at the vicinity of a clock signal input pin of a phase-locked loop circuit to which a clock signal is input to match a time constant of a data strobe signal line with a time constant of a clock signal line. The matching of input timings of the clock signal and the data strobe signal input to the memory has an effect to reduce tDQSS and increase the timing margin. Further, it has another advantageous effect that the components additionally required to implement the invention are only one or two capacities (capacitors) (between CLK and CLKB or to CLK and CLKB) and thus a large occupying area is not required.

BRIEF DESCRIPTION OF THE DRAWINGS

FIG. 9A is a configuration diagram of a memory system, while

FIG. 10A is a schematic block diagram in which a load capacity is added to each CLK signal input portion of a PLL provided in a memory module according to the present invention, while

DESCRIPTION OF THE PREFERRED EMBODIMENTS

A memory module according to the present invention will be described in detail with reference to FIGS. 9A and 9B. Before starting the description, the problems entailed by a memory system using a conventional memory module(s) will be analyzed, and then the basic configuration of the memory module according to the present invention will be described based on a result of analysis.

Figure 9A:
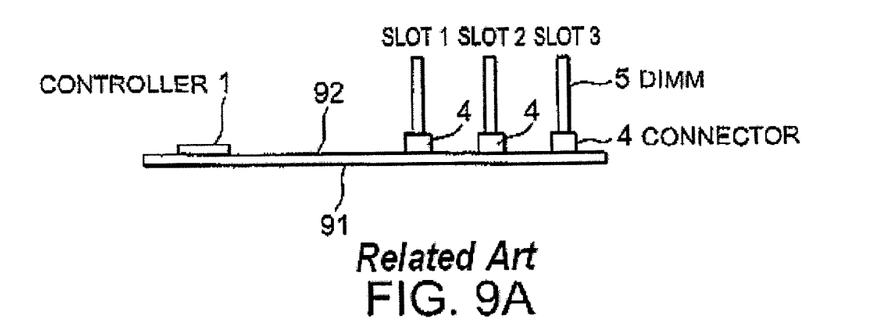
Figure 9B:
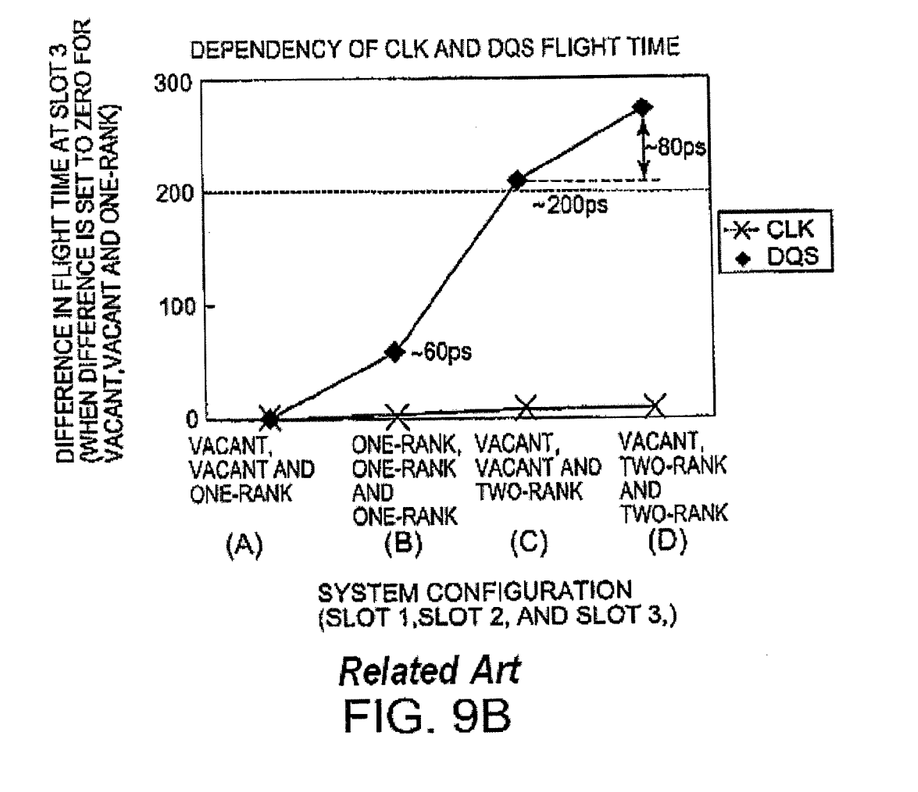
FIG. 9B is a graph illustrating flight time (propagation time) of DQS and CLK signals in the memory system of FIG. 9A.

FIG. 9A is a configuration diagram of a memory system using a conventional memory module(s), and FIG. 9B shows data relating to flight time (propagation time) of DQS and CLK signals in the memory system. The present inventor devised the memory module of the present invention based on the data on flight time (propagation time) of the DQS and CLK signals in this conventional memory system.

The memory system shown in FIG. 9A has a memory controller 1 and three slots on a motherboard 91, and the controller 1 and three slots are connected to each other by motherboard wirings 92. Each of the slots is provided with a connector 4 into which a corresponding DIMM 5 is inserted. The DIMMs 5 are detachable so that a memory system can be formed to have any desired memory capacity and any number of ranks.

FIG. 9B shows data obtained in memory systems having a registered DIMM(s) by calculating flight times (propagation times) of DQS and CLK signals based on write simulation waveforms from the memory controller 1 to the third slot that is farthest from the memory controller 1. Differences in propagation time are obtained by comparing the flight times (propagation times) with the flight time when one one-rank DIMM is inserted in the third slot that is used as the reference.

In FIG. 9B, (A) denotes a memory system used as the reference, in which the first and second slots are vacant and a one-rank DIMM is inserted in the third slot. (B) denotes a memory system in which one-rank DIMMs are inserted in all of the first, second, and third slots, respectively. (C) denotes a memory system in which the first and second slots are vacant and a two-rank DIMM is inserted in the third slot. (D) denotes a memory system in which the first slot is vacant, and two-rank DIMMs are inserted in the second and third slots, respectively.

In the memory systems (A) to (D) of FIG. 9B, the flight time (propagation time) of the CLK signal increases only slightly. The difference in flight time (propagation time) of the CLK signal due to the differences in the number of DIMMs and the number of ranks is so small that it can be said that the flight time (propagation time) of the CLK signal does not change significantly. On the other hand, when the flight time (propagation time) of the DQS signal is viewed in relation to the increase of the number of ranks, the difference between the memory system (A) with one one-rank DIMM (vacant, vacant, and one-rank DIMM) and the memory system (C) with one two-rank DIMM (vacant, vacant, and two-rank DIMM) is about 200 ps. When viewed in relation to the increase of the number of DIMMs, the difference between the memory system (A) with one one-rank DIMM (vacant, vacant, and one-rank DIMM) and the memory system (B) with three one-rank DIMMs (one-rank, one-rank, and one-rank DIMMS) is about 60 ps, while the difference between the memory system (C) with one two-rank DIMM (vacant, vacant, and two-rank DIMM) and the memory system (D) with two two-rank DIMMs (vacant, two-rank and two-rank DIMMS) is about 80 ps.

Consideration is given to the differences in flight time (propagation time) of the CLK signal and the DQS signal. The wirings in the motherboard and/or memory module are designed such that the wiring impedance of the wirings assumes a rated value in order to propagate the signal waveform correctly. In the motherboard wirings shown in FIG. 9A, the wiring impedance is made larger than the rated wiring impedance value at the positions where the slots are arranged. When a memory module is inserted in a slot, the impedance is connected in parallel to the position of the slot. The setting is made such that the rated wiring impedance is obtained in this state.

The memory module inserted in the slot is assumed to be a memory module having one memory rank. Accordingly, when a multiple-rank memory module is inserted, a multiplicity of DRAMs is connected in parallel and the wiring impedances at the slots are decreased, whereby the flight time (propagation time) is increased. This means that, in a multiple-rank memory module, the increase in the number of DRAMs connected in parallel to the DQS signal lines increases the flight time (propagation time). It is therefore believed that the difference in flight time (propagation time) due to the increase of the number of DIMMs is not significant, whereas the difference in flight time (propagation time) due to the increase of the number of ranks in one slot is large. The present invention has been made based on the findings that the DQS signal load varies depending on various memory system configurations whereas the CLK signal load stays stable, and that the number of ranks is more important than the number of DIMMs in terms of the influence to the flight time (propagation time) of the DQS signal.

The increase in flight time (propagation time) of the DQS signal can be considered as the increase of tDQSS. When the number of ranks is doubled, the flight time (propagation time) is increased by about 200 ps, whereas the flight time (propagation time) is increased only by about 60 to 80 ps even if the number of DIMMs is doubled or tripled. It is believed that the influence of the number of ranks to the DQS signal flight time (propagation time) is more important that of the number of DIMMs. The difference in flight time (propagation time) between the DQS signal and the CLK signal causes increase of tDQSS, leading to addition of pressure to the timing budget and over-specification. These pose serious obstacles to the increase of operation speed. Accordingly, it is essential to control the difference in flight time (propagation time) between the DQS signal and the CLK signal.

Desirably, this control can be done on the DIMMs. This is because the same motherboard is used for various different configurations of memory system (in the number of DIMMs or ranks). This is also because the flight time (propagation time) of the DQS signal is significantly dependent on the number of ranks as described above. In recent years, however, the restrictions on the wiring occupying area on the memory module or the number of elements other than the memory have become very severe. This is because it is required to mount even more memories in a smaller area as the capacity of the memory module is increased, the size thereof is reduced, and the functions are sophisticated.

The present inventor has discovered that adding a load capacity to a clock (CLK) signal input portion of the PLL of a multiple-rank memory module is effective to solve the problem above. Similar effects can be expected by adding a capacity to the vicinity of a CLK input portion of a DRAM, or adding a capacity to the vicinity of an output portion of the PLL. In this case, however, the number of required capacities (capacitors) is twice as many as the number of DRAMs mounted on the memory module, leading to increase of the occupying area. When an appropriate capacity is added to the vicinity of the CLK signal input portion of each PLL of a multiple-rank DIMM according to the present invention, only one or two more capacities are additionally required, and thus the increase of the occupying area can be prevented.

According to the present invention, a load capacity is added to vicinity of a CLK signal input portion of a PLL of a multiple-rank DIMM, the load capacity being according to the number of DRAMs connected in parallel to a DQS signal. The addition of the load capacity to the PLL CLK signal input portion matches time constants of input portions between a CLK signal line of the PLL and a DQS signal line of each of the DRAMs. The matching of the time constants matches the timing of the CLK signal received by the PLL with the timing of the DQS signal received by the DRAMs. Because it can be assumed that the CLK signal enters the DRAMs at the same timing as the CLK signal enters the PLL, the timings of the CLK and DQS signals input to the DRAMs are matched with each other. This reduces the tDQSS, while increasing the timing margin. As a result, a memory module which has multiple ranks and yet does not malfunction at high frequencies can be obtained.

First Embodiment

Figure 10A:
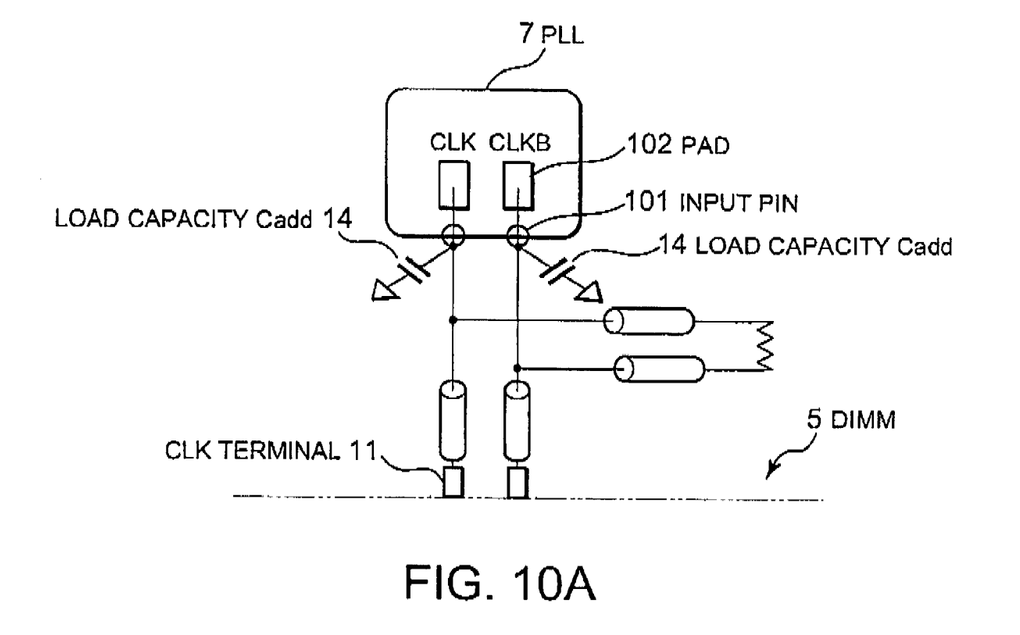
Figure 10B:
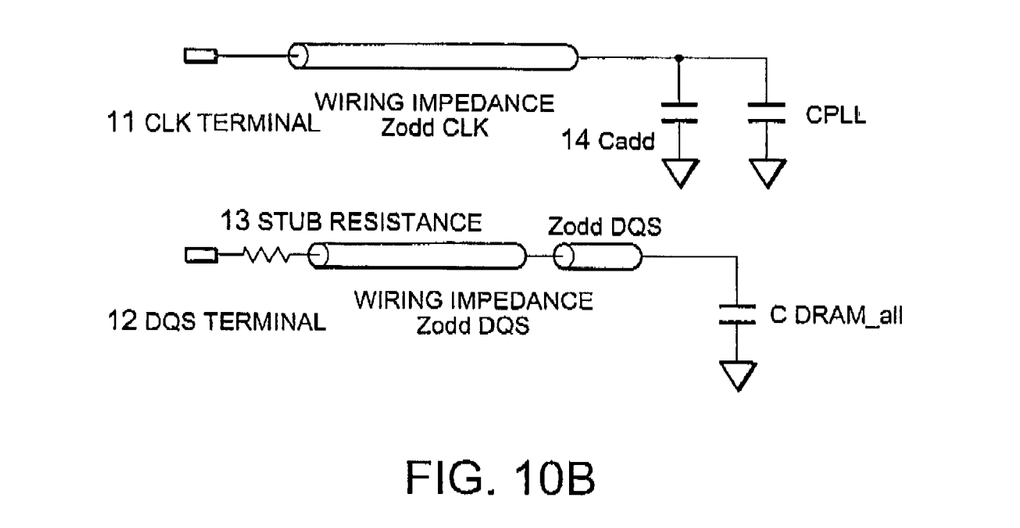
FIG. 10B is a schematic block diagram showing impedances of CLK and DQS signal lines of the memory module.
Figure 11:
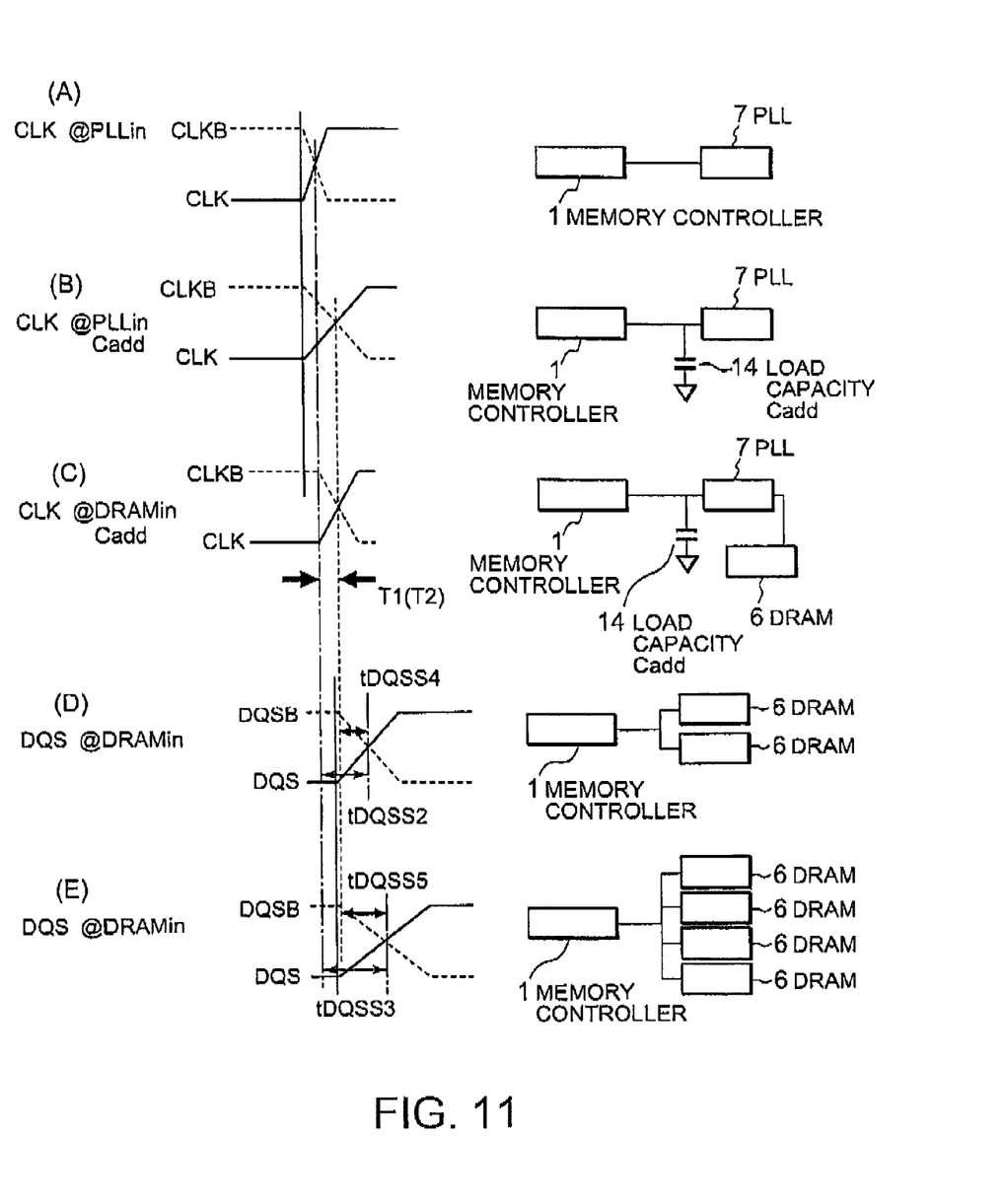
FIG. 11 shows waveform diagrams of CLK and DQS signal lines and respective schematic block diagrams of memory systems corresponding thereto according to a first embodiment of the present invention.

A first embodiment of the present invention will be described with reference to FIGS. 10A, 10B and 11. In the first embodiment, a load capacity is added to a CLK signal input portion of a PLL 7 of a memory module 5, FIG. 10A is a schematic configuration diagram in which the load capacity for timing adjustment is added to each of the CLK signal input portions of the PLL 7, and FIG. 10B is a schematic diagram showing impedances of a CLK signal line and a DQS signal line. FIG. 11 shows signal waveform diagrams and schematic block diagrams of corresponding memory systems, FIG. 10A, shows that the PLL has only CLK and CLKB signal input pins 101 and pads 102, while other components and parts of the PLL are omitted.

In this embodiment, a clock signal is complementary CLK and CLKB signals, which are input to the clock signal input pins 101 of the PLL 7 through the input terminals 11 of the DIMM 5. The load capacity Cadd 14 is added to each of the CLK and CLKB input pins 101 of the CLK and CLKB signal input portions of the PLL 7. The load capacity Cadd 14 that is required to be added to the PLL input portion in order to equalize time constants of the PLL CLK signal line and the DQS signal line can be obtained by the following formula.

$$Z_{odd\_CLK} \times (C_{add} + C_{pll}) = (R + Z_{odd\_DQS}) \times C_{dram\_all} \quad \text{(Formula 1)}$$

In the formula (1) above, Zodd_CLK denotes an odd mode impedance of the CLK signal line pair, Cpll denotes a CLK signal input capacity of the PLL, R denotes a resistance value of a DQS signal stub resistance, Zodd_DQS denotes an odd mode impedance of the DQS signal line pair, and Cdram_all denotes a total sum of DRAM input capacities of the DQS signals connected commonly on the same memory module. The left side of the formula (1) represents the time constant of the clock signal line from the input terminal 11 to the CLK input pin 101 of the PLL 7 in the memory module 5. The right side represents the time constant of the data strobe signal line from the input terminal 12 to DQS input pin of the DRAM 6 in the memory module 5. The timings of the CLK signal and the DQS signal entering the DRAM are matched by equalizing these time constants.

The operation will be described with reference to FIG. 11. When a load capacity Cadd satisfying the formula (1) is added to the vicinity of the CLK signal input portion of the PLL, the waveform is deteriorated by the effect of the time constant determined by the wiring (transmission line) and the capacity. This retards the cross point of the CLK signal by time T1 (or T2) in comparison when no capacity load is added. The waveform (A) in FIG. 11 represents a waveform of the CLK signal at the PLL input portion when no capacity load is added (@PLLin). The waveform (B) represents a waveform of the CLK signal at the PLL input portion when the capacity load Cadd is added (@PLLin (Cadd)). The waveform (C) represents a CLK signal waveform (@DRAMin (Cadd)) at the DRAM input portion when the capacity load Cadd is added. As seen from these waveform diagrams, the addition of the capacity load Cadd retards the CLK signal by time T1 (T2). Although these diagrams show the T1 and the time T2 together as T1 (T2), the T1 corresponds to an amount of delay for a capacity Cadd1 in a two-rank memory module, while the T2 corresponds to an amount of delay for a capacity Cadd2 in a four-rank memory module.

The waveform (D) represents a DQS signal waveform of the DRAM when one two-rank DIMM is inserted into the slot. In this case, tDQSS4 is obtained which is improved by time T1 in comparison with the tDQSS2 in FIG. 8. The waveform (E) represents a DQS signal waveform of the DRAM when one four-rank DIMM is inserted into the slot. In this case, tDQSS5 is obtained which improved by time T2 in comparison with the tDQSS3 in FIG. 8. In this manner, the CLK signal is improved by the amount of delay T1 (T2), which reduces the tDQSS and increases the timing margin.

According to the first embodiment, the load capacity Cadd satisfying the formula (1) is added to the vicinity of the CLK signal input portion of the PLL in the multiple-rank memory module. The time constants of the clock signal line and the data strobe signal line in the memory module are equalized by the addition of the load capacity Cadd, whereby the timings of the CLK signal and the DQS signal entering the DRAM are matched with each other. The matching of the timings of the CLK signal and the DQS signal entering the DRAM reduces the tDQSS, and thus increases the timing margin. As a result, a multiple-rank memory module operable at high speed can be provided.

Second Embodiment

Figure 12A:
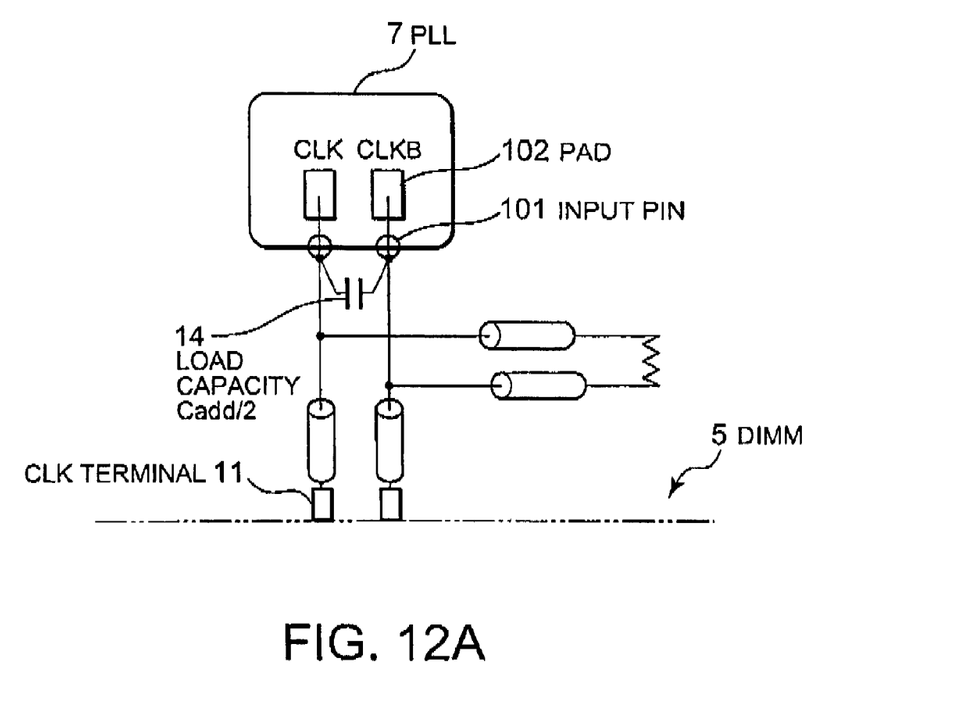
FIG. 12A is a schematic block diagram in which a load capacity is added between complementary inputs of CLK signals according to a second embodiment of the invention.
Figure 12B:
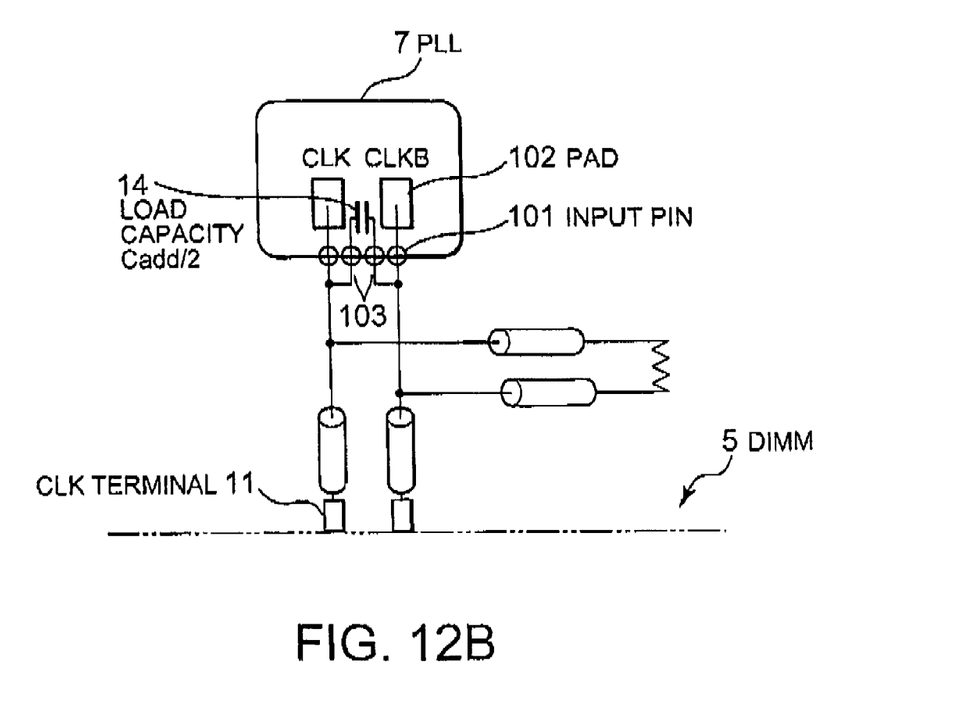
FIG. 12B is a schematic block diagram illustrating a modified example of the memory module of FIG. 12.
Figure 13A:
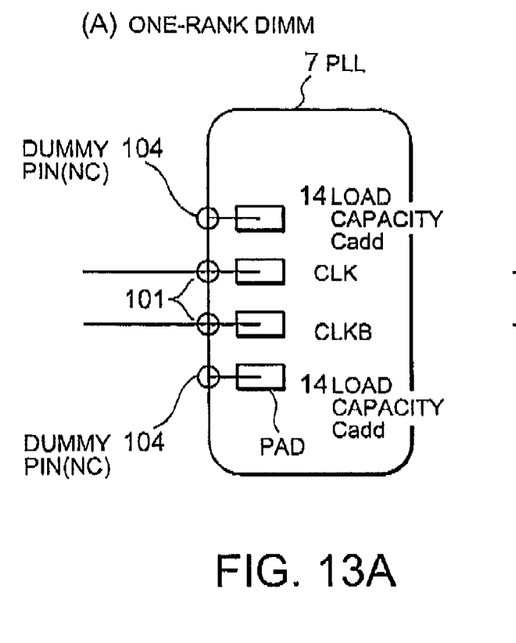
FIGS. 13A and 13B show schematic block diagrams showing other examples of the second embodiment in which load capacities are provided at CLK signal input portion in a PLL.
Figure 13B:
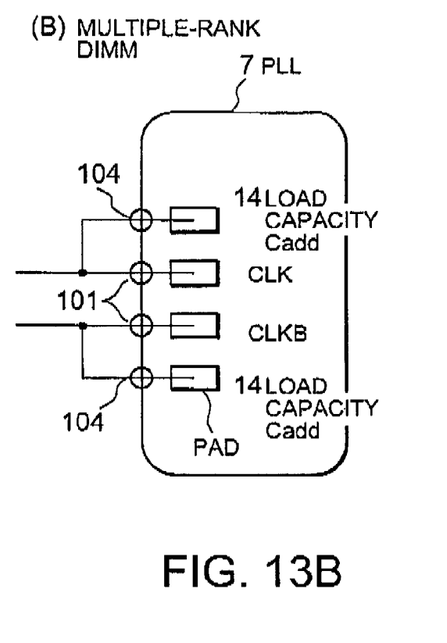
Figure 14:
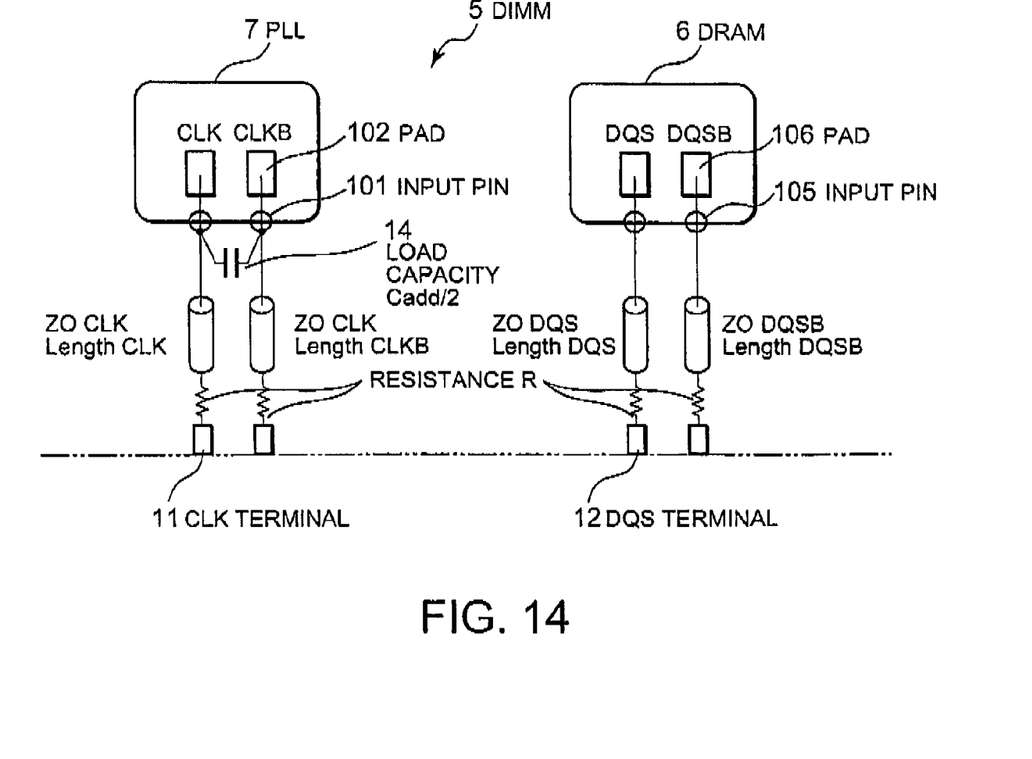
FIG. 14 is a schematic block diagram showing still another example of the second embodiment in which a load capacity is added to the CLK signal input portions.

A second embodiment of the present invention will be described with reference to FIGS. 12, 12B, 13A, 13B and 14. FIG. 12A is a schematic configuration diagram in which a load capacity is added between the complementary inputs of the CLK signals. FIG. 12B shows a modified example of the memory module of FIG. 12A. FIGS. 13A and 13B are schematic configuration diagrams in which a load capacity provided in the PLL is added to the CLK signal. FIG. 14 is a schematic configuration diagram showing configuration of a memory module that the CLK signal lines and the DQS signal lines are similar in structure and that an additional load capacity is added. These figures illustrate the PLL 7 and the DRAM 6 according to the second embodiment, showing only the input pins 101 and 105 and pads 102 and 106 relating to the present invention while omitting other components.

As shown in FIG. 12A, clock signal input pins 101 corresponding to complementary CLK signal input pair (CLK and CLKB) are connected with a load capacity 14. A half of the capacity value Cadd in the formula (1) will be enough for the load capacity 14. Thus, the memory module according to the second embodiment requires only one load capacity having the half capacity value, and hence requires a smaller number of components and a smaller occupying area.

Additionally, the load capacity 14 of FIG. 12A may be provided within the PLL together with dummy pins 103 as shown in FIG. 12B. In this case, the opposite ends of the load capacity 14 are connected to the dummy pins 103. The dummy pins 103 are further connected to the clock signal input pins 101.

As shown in FIGS. 13A and 13B, dummy pins 104 and load capacities Cadd 14 are provided in the PLL 7. One ends of the load capacities Cadd 14 are connected to the dummy pins 104, respectively. When the memory module is used as one-rank DIMM, the dummy pins 104 are nonconnected pins as shown in FIG. 13A. When the memory module is uses as multi-rank DIMM, the dummy pins are connected to the CLK and CLKB signal input pins 101 of the PLL 7 on the DIMM 5. In this case, the load capacity is added or adjusted so as to equalize the time constant of the clock signal line and the time constant of the data strobe signal line. This eliminates the need of arranging a capacity on the DIMM, and hence reduces the number of components required and reduces the occupying area. The load capacity having the half capacity value may be connected between the complementary clock signal pair.

As shown in FIG. 14, the layout design for the CLK signal including the characteristic impedance, wiring length, wiring width, wiring layers, stub resistance value, and terminal ends of the wiring extending between the DIMM terminal and the PLL is equalized with the layout design for the DQS signal including the characteristic impedance, wiring length, wiring width, wiring layers, stub resistance value, and terminal ends of the wiring extending between the DIMM terminal and the DRAM. A load capacity 14 is added to the CLK input portions of the PLL 7 to match the capacity thereof with the capacity of the DQS input pin portion of the DRAM connected to another DRAM(s) (not shown) in common. The characteristics of the CLK signal line between the DIMM terminal and the PLL are matched with the characteristics of the DQS signal line between the DIMM terminal and the DRAM. In this manner, the timings of the clock (CLK) signal received by the PLL and the data strobe (DQS) signal received by the DRAM can be matched with high precision.

According to the embodiments described above, there are various methods of adding a load capacity Cadd to the vicinity of the CLK signal input portion of the PLL in order to equalize the time constant of the clock signal line with the time constant of the data strobe signal line in the memory module. All of these methods match the timings of the CLK signal and the DQS signal entering the DRAM by the addition of the load capacity Cadd. The matching of the timings of the CLK signal and the DQS signal entering the DRAM reduces the tDQSS and increases the timing margin. As a result, a multiple-rank memory module operable at high speed can be provided.

According to the present invention, a load capacity Cadd is added to the vicinity of the CLK signal input portion of the PLL in order to equalize the time constant of the clock signal line with the time constant of the data strobe signal line in the memory module. However, approximate values of the wiring length, wiring impedance and the like in the motherboard are publicly known. Therefore, it is also possible to match the time constant of the clock signal lines with the time constant of the data strobe signal lines in consideration of the motherboard. The matching of the time constants of the wirings in not only the DIMM but also the motherboard makes it possible to match the timings of the clock (CLK) signal and the data strobe (DQS) signal with even higher precision. As a result, a multiple-rank memory module operable at high speed can be provided, Having described the invention based on the preferred embodiments with a certain degree of particularity, the present invention is not limited to the embodiments but may be otherwise variously embodied within the spirit and scope of the invention. Further, the embodiments described above include various aspects of the invention, and various inventions may be devised by suitably combining the disclosed constituent requirements. For example, some of the components according to the foregoing embodiments may be omitted as long as the desired effect can be obtained.

What is claimed is:

1. A memory module with a multiple-rank configuration comprising:
    a phase-locked loop circuit for distributing a clock signal to memories; and
    a load capacity provided at a clock signal input portion of the phase-locked loop circuit in order to match input timings of a clock signal and a data strobe signal entering each of the memories,
    wherein another load capacity having a half of a capacity value of the load capacity is provided between complementary signal lines of the clock signal as a substitute for the load capacity.

2. The memory module according to claim 1, wherein one end of the load capacity provided within the phase-locked loop circuit is connected to a dummy pin, and a clock signal input pin of the phase-locked loop circuit is connected to the dummy pin.

3. The memory module according to claim 1, wherein a layout design for the clock signal within a memory module board, including a characteristic impedance, a wiring length, a wiring width, wiring layers, a stub resistance value and terminal ends of a wiring extending between a clock terminal and an input pin of the phase-locked loop circuit is made equal to a layout design for the data strobe signal including a characteristic impedance, a wiring length, a wiring width, wiring layers, a stub resistance value and terminal ends of a wiring extending between a data strobe terminal and an input pin of each memory; and
    the load capacity is added to the clock signal input portion of the phase-locked loop circuit whereby a total capacity value of data strobe signal input pins of the memories connected to the data strobe signal is made equal to a capacity value of the clock signal input portion of the phase-locked loop circuit.

4. The memory module according to claim 1, wherein the load capacity is set such that a time constant of a data strobe signal line in a signal wiring transmitting the data strobe signal from a memory controller to an input pin of each memory is equal to a time constant of a clock signal line in a signal wiring transmitting the clock signal from the memory controller to an input pin of the phase-locked loop circuit.

5. A memory module with a multiple-rank configuration comprising:
    a phase-locked loop circuit for distributing a clock signal to memories; and
    a load capacity provided at a clock signal input portion of the phase-locked loop circuit in order to match input timings of a clock signal and a data strobe signal entering each of the memories,
    wherein the load capacity is set such that a time constant of a data strobe signal line represented by a product of a sum of a stub resistance and a wiring impedance in a wiring transmitting the data strobe signal multiplied by an input pin capacity of each memory receiving the data strobe signal is equal to a time constant of a clock signal line represented by a product of a sum of the load capacity and a clock signal input pin capacity of the phase-locked loop circuit multiplied by a wiring impedance of the clock signal, and
    wherein another load capacity having a half of a capacity value of the load capacity is provided between complementary signal lines of the clock signal as a substitute for the load capacity.

6. A memory module with a multiple-rank configuration comprising:
    a phase-locked loop circuit for distributing a clock signal to memories: and
    a load capacity provided at a clock signal input portion of the phase-locked loop circuit in order to match input timings of a clock signal and a data strobe signal entering each of the memories,
    wherein the load capacity is set such that a time constant of a data strobe signal line represented by a product of a sum of a stub resistance and a wiring impedance in a wiring transmitting the data strobe signal multiplied by an input pin capacity of each memory receiving the data strobe signal is equal to a time constant of a clock signal line represented by a product of a sum of the load capacity and a clock signal input pin capacity of the phase-locked loop circuit multiplied by a wiring impedance of the clock signal, and
    wherein opposite ends of another load capacity having a half of a capacity value of the load capacity and provided within the phase-locked loop circuit as a substitute for the load capacity are connected to dummy pins, respectively, and complementary clock signal input pins of the phase-locked loop circuit are connected to the dummy pins, respectively.

* * * * *